United States Patent [19]
Leighton

[11] Patent Number: 5,817,207
[45] Date of Patent: Oct. 6, 1998

[54] RADIO FREQUENCY IDENTIFICATION CARD AND HOT LAMINATION PROCESS FOR THE MANUFACTURE OF RADIO FREQUENCY IDENTIFICATION CARDS

[76] Inventor: Keith R. Leighton, 2817 Fulmer Rd., Lorain, Ohio 44053

[21] Appl. No.: 727,789

[22] Filed: Oct. 7, 1996

Related U.S. Application Data

[60] Provisional application No. 60/005,685 Oct. 17, 1995.
[51] Int. Cl.⁶ .................................................. B32B 31/20
[52] U.S. Cl. ........................................... 156/298; 156/312
[58] Field of Search .................................... 156/300, 312, 156/311, 298

[56] References Cited

U.S. PATENT DOCUMENTS

| | | |
|---|---|---|
| 4,450,024 | 5/1984 | Haghiri-Tehrani et al. ............ 156/108 |
| 4,701,236 | 10/1987 | Vieilledent . |
| 4,792,843 | 12/1988 | Haghiri-Tehrani et al. . |
| 4,795,898 | 1/1989 | Bernstein et al. . |
| 4,980,802 | 12/1990 | Champagne et al. . |
| 5,067,008 | 11/1991 | Yanaka et al. ............................ 357/81 |
| 5,097,117 | 3/1992 | Champagne et al. . |
| 5,173,840 | 12/1992 | Kodai et al. . |
| 5,208,450 | 5/1993 | Uenishi et al. . |
| 5,268,699 | 12/1993 | Laute et al. . |
| 5,396,650 | 3/1995 | Terauchi ................................. 455/38.2 |
| 5,412,192 | 5/1995 | Hoss . |
| 5,438,750 | 8/1995 | Venambre . |
| 5,567,362 | 10/1996 | Grun . |

*Primary Examiner*—Francis J. Lorin
*Attorney, Agent, or Firm*—Oldham & Oldham Co., L.P.A.

[57] ABSTRACT

A plastic card, such as a radio frequency identification card, including at least one electronic element embedded therein and a hot lamination process for the manufacture of radio frequency identification cards and other plastic cards including a micro-chip embedded therein. The process results in a card having an overall thickness in the range of 0.028 inches to 0.032 inches with a surface suitable for receiving dye sublimation printing—the variation in card thickness across the surface is less than 0.0005 inches. A card manufactured in accordance with the present invention also complies with all industry standards and specifications. Also, the hot lamination process of the present invention results in an aesthetically pleasing card. The invention also relates to a plastic card formed in accordance with the hot lamination process of the present invention.

17 Claims, 3 Drawing Sheets

5,817,207

RADIO FREQUENCY IDENTIFICATION CARD AND HOT LAMINATION PROCESS FOR THE MANUFACTURE OF RADIO FREQUENCY IDENTIFICATION CARDS

This application claims the benefit of the following: U.S. Provisional Application No.: 60/005,685, filing date Oct. 17, 1995.

FIELD OF THE INVENTION

The present invention relates generally to plastic cards and the manufacture thereof, and more particularly to radio frequency identification (RFID) cards and the manufacture of RFID cards that conform to industry size and performance standards and conventions and that have a superior outer surface to known RFID cards such that card may receive dye sublimation printing or the like.

BACKGROUND OF THE INVENTION

As the use of plastic cards for credit cards, automated teller machine (ATM) cards, identification cards, and like continues to become more widespread, the problems associated with the use of such cards correspondingly increase. Credit card fraud and identification card fraud are becoming larger problems everyday, and this fraud has introduced uncertainties into our systems of commerce and our security systems. Using easily available technology, criminals are able to manufacture credit/debit cards, ATM cards, identification cards, and the like having another's account code, identification code, or other personal information embedded in the magnetic stripe thereof. Thus, for example, criminals may steal hundreds or thousands of legitimate credit card account numbers and manufacture many additional cards bearing the stolen information. These fraudulent cards are then usable by the criminals to purchase goods and to receive cash with the legitimate card holder and the card issuer left holding the bill. Likewise, so called debit cards are becoming increasingly popular. These cards have stored thereon a certain amount of value for which the card owner has previously paid. For example, a subway rider may purchase a card good for 50 fares, with one fare being deducted from the card each time the owner rides the subway. Criminals have also been able to manipulate the data stored on these cards to defraud the merchants and others.

The ease in which criminals have been able to manufacture and or manipulate known cards results from the existence of the easily altered magnetic stripe storage medium used by known cards. These magnetic stripes are easily programmed and reprogrammed using commonly available technology. Thus, there has been found a need in the plastic card industry to provide a more secure plastic card that is very difficult or impossible to fraudulently manipulate. The most likely solution to the above-noted problems associated with known plastic cards is the RFID card and other cards including computer chips embedded therein rather than, or in addition to, a magnetic stripe. While these RFID cards and like have been found to be successful in preventing or limiting fraud, they are more difficult and expensive to manufacture relative to ordinary magnetic stripe cards. One of the biggest obstacles to the wide spread manufacture and use of RFID cards has been the inability of card manufacturers to manufacturer an RFID card that meets all industry standards and specifications, such as those set by the International Standards Organization (ISO), that are sufficiently aesthetically pleasing (wherein the embedded electronics are hidden from view), and that have a sufficiently regular or flat surface such that one or both surfaces of the card may be printed on using the very popular and widespread dye sublimation technology. Known plastic cards with computer chips and like embedded therein are too thick to work in connection with existing card reading machinery (ATM machines, telephones, and like) and have a surface that is too irregular to properly and consistently receive dye sublimation printing. Furthermore, prior attempts to manufacture a sufficiently thin plastic card including a computer chip embedded therein have resulted in a card with inferior aesthetic qualities such as the ability to see the embedded computer chip through the plastic.

SUMMARY OF THE INVENTION

The present invention is therefore directed to a plastic card having at least one electronic element embedded therein and to a hot lamination method for the manufacture of plastic cards including at least one electronic element therein. The card has an overall thickness in the range of 0.028 inches to 0.032 inches and comprises a plastic core having at least one electronic element embedded therein with at least one of the upper and lower surfaces of the core comprising a coating printed or otherwise applied thereon. An overlaminate film is preferably provided over the coated surface of the core and the resulting card has a variation in thickness across the surfaces thereof of no greater than approximately 0.0005 inches. The hot lamination method of the present invention comprises the steps of providing first and second plastic core sheets, positioning at least one electronic element between the first and second core sheets to thus form a core, and placing the core in a laminator and closing the laminator without applying laminator ram pressure to the core. A heat cycle is applied to the core sheets in the laminator thus liquefying or partially liquefying the sheets. The laminator ram pressure is then increased in combination with the heat. A cooling cycle is then applied to the core in the laminator, preferably with an associated increase in ram pressure, and the core is removed from the laminator. At least one surface of the core is then printed on using a printing press or similar printing apparatus, a sheet of overlaminate film is placed on at least one side of the core, and the core is then again placed in a laminator. A heat cycle is applied to the core with its overlaminate film, and a cooling cycle is thereafter applied, resulting in a sheet of plastic card stock from which one or more cards may be cut. The invention is also directed to a card manufactured in accordance with the above process which results in a plastic card having a thickness in the range of approximately 0.028 inches to 0.032 inches with a surface smoothness of at least approximately 0.0005 inches as is required by ISO and American National Standards Institute (ANSI) standards.

The present invention provides numerous advantages over known plastic cards and known plastic card manufacturing processes, including the formation of a plastic card with electronic elements such as a computer chip embedded therein with a pleasing aesthetic appearance, with a sufficiently smooth and regular surface such that the card may receive dye sublimation printing, and with sufficient durability and characteristics to comply with all industry specifications and standards.

DETAILED DESCRIPTION OF THE INVENTION

The present invention relates to a plastic card including at least one electronic element embedded therein. The present invention also relates to a hot lamination process for the manufacture of plastic cards, and more particularly to a hot lamination process for the manufacturer of plastic cards that include an electronic element, such as a computer chip or other electronic element embedded therein. The electronic element may perform a wide variety of functions and take a wide variety of forms. Such cards, without regard to the particular electronic element embedded therein, will hereinafter be referred to as radio frequency identification (RFID) cards. The present invention also relates to a card formed in accordance with the invention.

Figure 1:
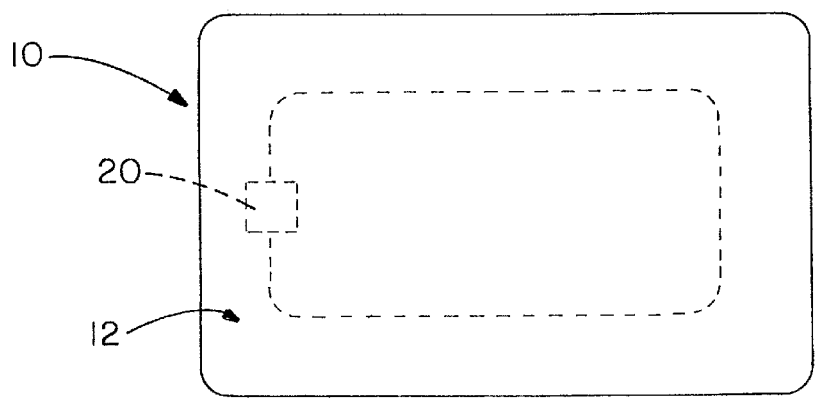
FIG. 1 is a top plan view of a plastic card in accordance with the present invention.
Figure 2:
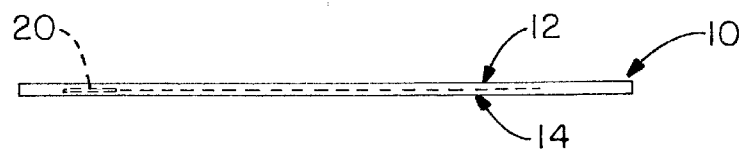
FIG. 2 is a side elevational view of the card shown in FIG. 1.
Figure 3A:
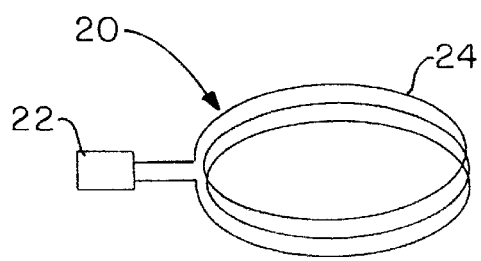
FIGS. 3A–3C are top plan views of various electronic elements that may be embedded in a card in accordance with the present invention.
Figure 3B:
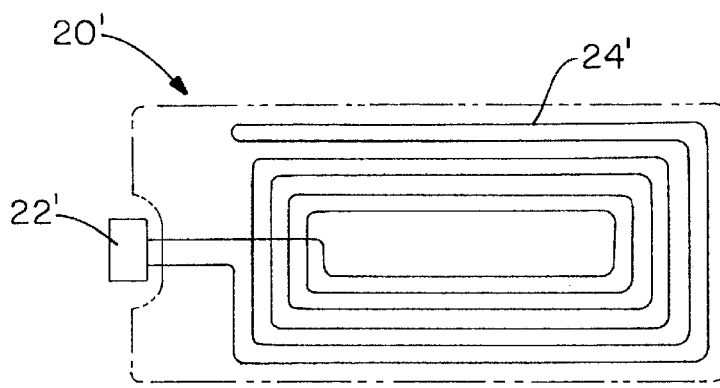
Figure 3C:
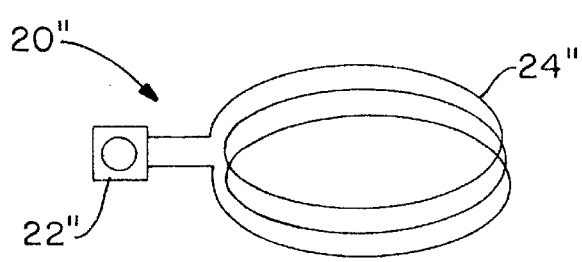
Figure 4:
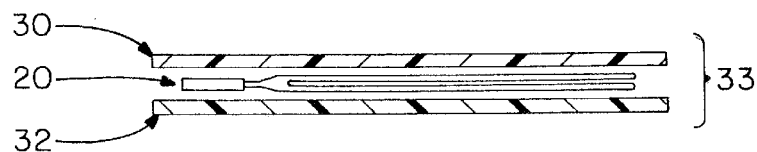
FIG. 4 is an exploded, schematic view of an electronic element position between two plastic core sheets to form a core.
Figure 5:
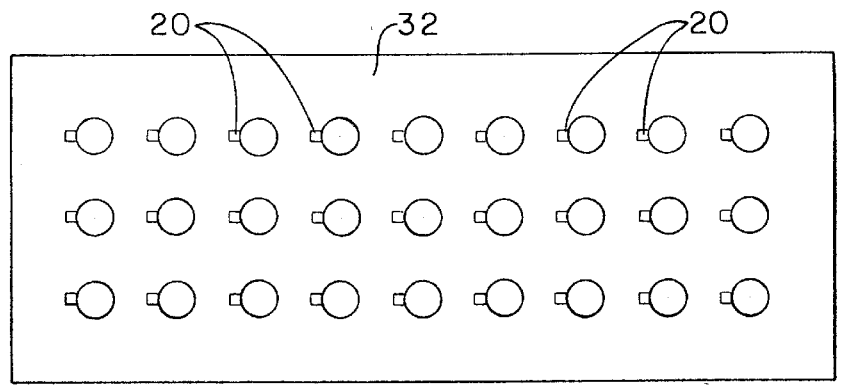
FIG. 5 is a top plan view of a plurality of electronic elements positioned on a sheet of plastic core stock such that they may be covered by a similar sheet of core stock.
Figure 6:
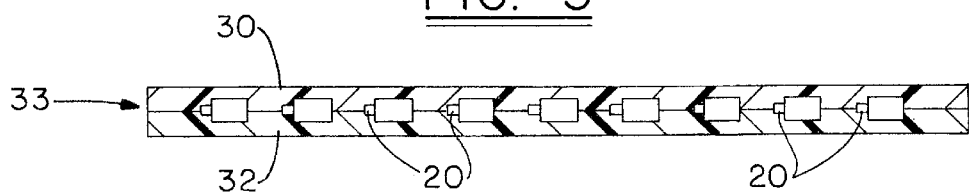
FIG. 6 is a schematic cross-sectional view of one or more electronic elements positioned between sheets of plastic core stock.

Referring now to FIG. 1, there can be seen a plastic RFID card 10 manufactured in accordance with the present invention and including an electronic element 20 embedded therein. Card 10 includes an upper surface 12 and a lower surface 14. Electronic element 20 may take a wide variety of forms and perform a wide variety of functions. As shown in FIG. 3A–3C respectively, electronic element 20, 20', 20" may be provided by a micro-chip 22 including a wire antenna 24 connected thereto, a micro-chip 22' and a circuit board antenna 24', a read/write micro-chip 22" and a wire coil antenna 24", or any other suitable electronic element. These electronic elements 20, 20', 20" and their insertion into plastic cards is not new, however, the present invention provides a new hot lamination process for manufacturing plastic cards 10 with these electronic elements 20, 20', 20" embedded therein such that the cards 10 are of a superior quality, such that the cards 10 meet all ISO and other industry specifications and standards, in such that at least one of the upper and lower surfaces 12, 14 of card 10 is sufficiently smooth and is otherwise is capable of receiving dye sublimation printing. Specifically, a card in accordance with the present invention has a thickness of approximately in the range of 0.028 inches to 0.032 inches with a surface smoothness of 0.0005 inches.

As shown in FIGS. 4–10 one or more cards 10 in accordance with the present invention may be manufactured by positioning an electronic element 20 between first and second sheets of card stock 30, 32 to form a core 33. Preferably is shown in FIG. 5–10, a plurality of cards are manufactured simultaneously, in thus, a plurality of electronic elements 20 are positioned between the first and second sheets of plastic core stock 30, 32 (only the second sheet 32 begin shown in FIG. 5 for clarity). When a plurality of electronic elements 20 are positioned between first and second sheets plastic core stock 30, 32, electronic elements 20 are properly positioned relative to one another such that a plurality cards may be cut from the resulting card stock. Plastic core sheets 30, 32 may be provided by a wide variety of plastics, the preferred being polyvinyl chloride (PVC) having a thickness in the range of 0.007 inches to 0.024 inches and preferably having a thickness of approximately 0.0125 inches each. Those skilled in the art will recognize that the thickness of the plastic core sheets will depend upon the thickness of the one or more electronic elements that are to be embedded therebetween. Other suitable plastics that may be utilized include polyester, acrylonitrile-butadiene-styrene (ABS), and any other suitable plastic.

Figure 7:
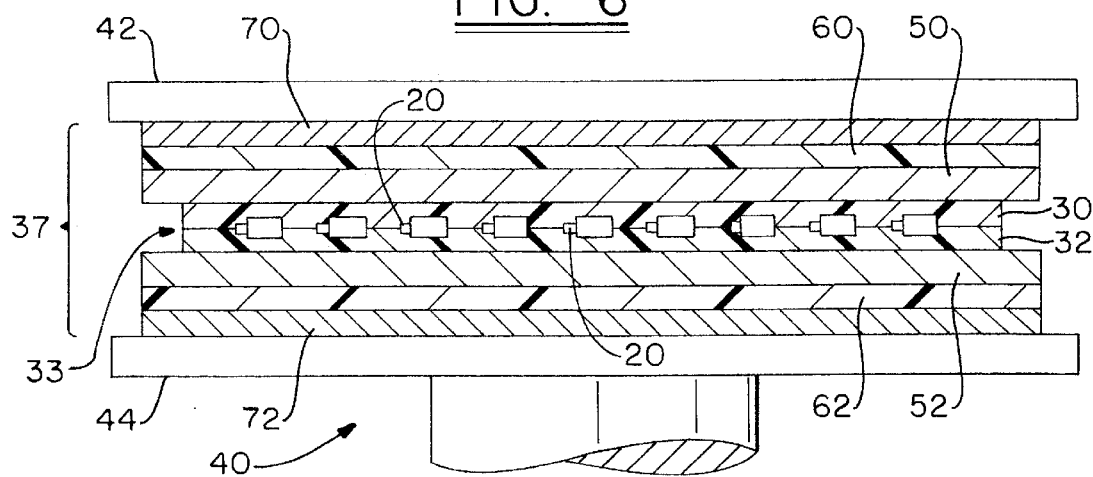
FIG. 7 schematically illustrates a book comprising the core, as it is positioned in a laminator apparatus.

Subsequent to placing one or more electronic elements 20 between the first and second sheets 30, 32 of plastic core stock to form a core 33, this core 33 is placed in a laminator apparatus 40 of the type well known in the art of plastic card manufacturing. As is shown in FIG. 7, laminator 40 includes upper and lower platens 42, 44 for applying ram pressure to an article positioned therebetween. In addition to the ability to apply ram pressure, laminator 40 is preferably of the type having controlled platens 42, 44 that may provide both heat and chill cycles and preferably includes cycle timer to regulate cycle time. Core 33 is positioned between first and second laminating plates 50, 52, one of which is preferably matte finished to provide laminated core 33 with at least one textured outer surface. First and second laminating pads 60, 62 are positioned outside of the laminating plates 50, 52, and first and second steel plates 70, 72 are likewise positioned outside of pads of 60, 62 and the entire assembly forms a book 35 for being positioned in laminator 40 between platens 42, 44.

Once book 35 is positioned in laminator 40 as shown in FIG. 7, the first lamination cycle is initiated by closing laminator platens 42, 44, preferably applying little or no ram pressure to book 35. A laminator heat cycle is initiated, bringing the temperature of platens 42, 44 up to a range of 275° F. to 400° F., and most preferably up to a range of 300° F. to 370° F. for a period of greater than 5 minutes, and preferably in the range of 7 to 10 minutes. Once the heat cycle has been applied to the book 35 as is set forth above, the ram pressure of laminator 40 is increased to facilitate the flow of the plastic core sheets 30, 32 so that the one or more electronic elements 20 are encapsulated there by, and so that sheets 30, 32 form a uniform core 33 (seen most clearly in FIGS. 8–10) with upper and lower surfaces 34, 35. As mentioned, the use of matte finished laminator plates 50, 52 provides surfaces 34, 35 with a slightly roughened or textured quality which will facilitate the application of a coating thereto as is discussed below. The ram pressure applied during the heat cycle and the length of the heat cycle may vary, depending especially upon the size of sheets 30, 32. For example, the cycle time may be in the range of 10–15 minutes. In one example, a ram pressure of 940.135 pounds per square inch (p.s.i.) was applied for 10–15 minutes to form a uniform core 33, using sheets 30, 32 of a size in the range of 12 inches by 24 inches to 24 inches by 36 inches.

Subsequent to the above heat cycle, laminator 40 applies a chill cycle to book 35 during which time the ram pressure of the laminator 40 is increased, preferably by approximately 25% until the platens 42,44 have cooled to approximately 40° F. to 65° F. for approximately 10–15 minutes. Core 33 may then be removed from laminator 40 for additional processing.

Figure 8:
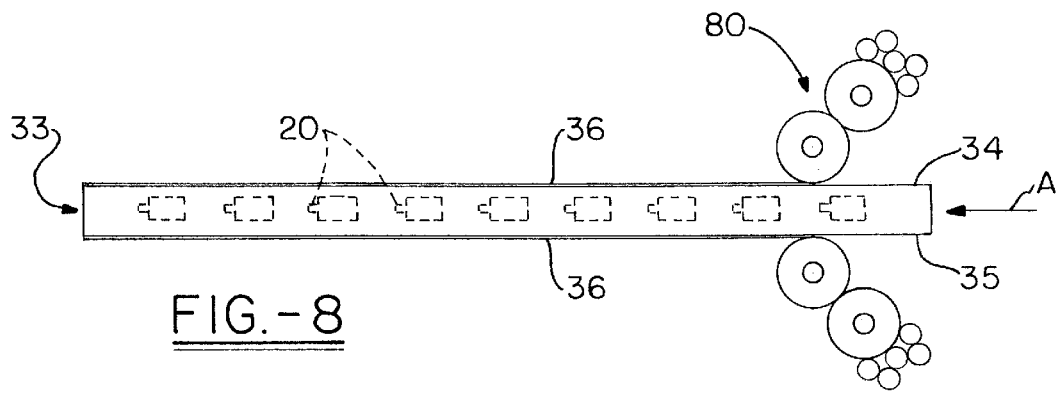
FIG. 8 schematically illustrates the core as it is being printed on after removal from the laminator using a printing press or similar printing apparatus.

Subsequent to the removal of core 33 from laminator 40, and as illustrated in FIG. 8, core 33 is coated on at least one of it's upper and lower surfaces 34, 35 with a layer of printing ink 36. This may be accomplished using a wide variety of printing techniques such as offset printing, letterpress printing, screen printing, roller coating, spray printing, litho-printing, and other suitable printing techniques. As shown in FIG. 8, core 33 is fed in the direction indicated with arrow A through a printing press, a lithographic printer, or a similar apparatus 80. This printing step is performed to coat at least one surface 34, 35 of core 33 with a layer of aesthetically pleasing ink 36. This layer of ink 36 cosmetically hides the one or more electronic elements 20 that are embedded within core 33, and prevents these one or more electronic elements 20 from showing through the relatively thin core 33. In this manner, the one or more electronic elements 20 encapsulated in core 33 are completely hidden from view without requiring the plastic used in the manufacture core 33 to be excessively thick.

Figure 9:
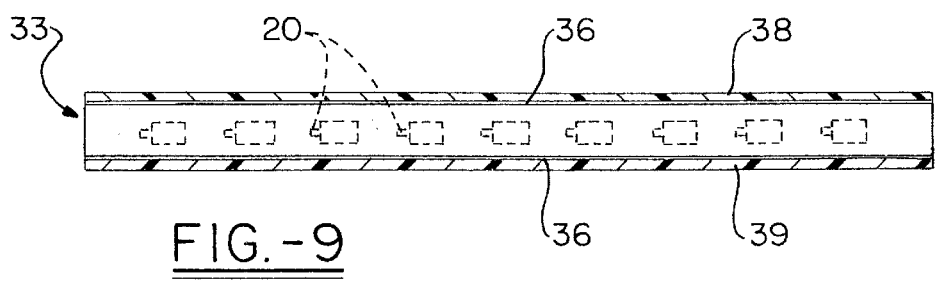
FIG. 9 is a cross-sectional view schematically illustrating the application of an overlaminate film to at least one side of the core.
Figure 10:
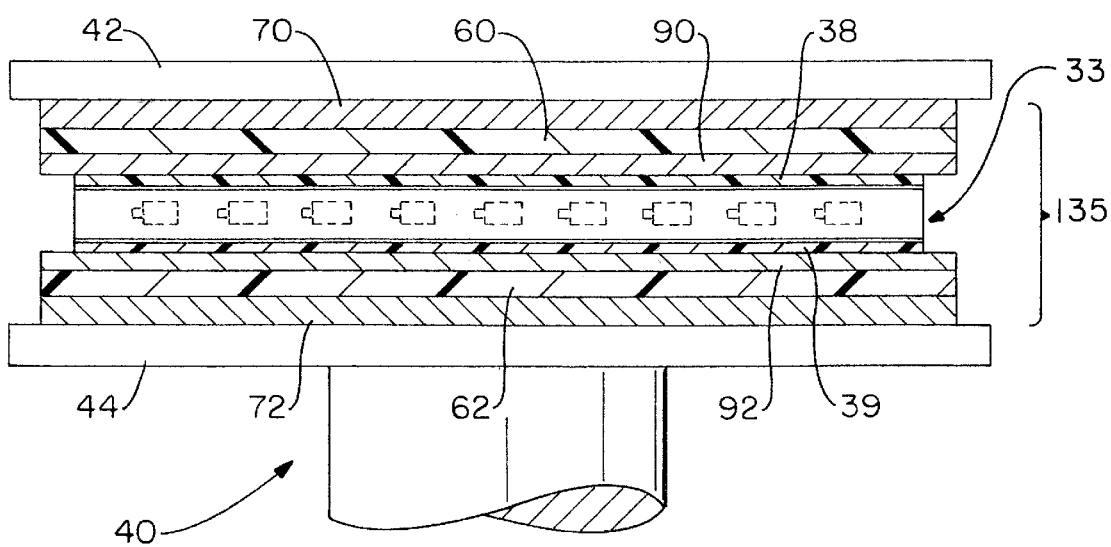
FIG. 10 schematically illustrates the core with overlaminate film, as it is placed in a laminator for final processing to form a sheet of card stock.

Referring now to FIGS. 9–10, the final processing of core 33, which now comprises a layer of ink 36 or the like on at least one surface 34,35 thereof, is schematically illustrated. A layer of overlaminate film such as clear overlaminate film 38,39 is positioned on at least one ink coated surface 34,35 of core 33, and preferably core 33 is positioned between two similar sheets of overlaminate film 38,39 as shown. Overlaminate film is very thin, for example in the range of 0.0015" thick. A book 135 is then constructed for insertion into laminator 40 as is schematically illustrated FIG. 10. Book 135 comprising core 33, including at least one layer of ink 36 and at least one layer of overlaminate film 38, 39 is positioned between laminating plates which are preferably highly polished plates such as mirror finished stainless steel plates 90, 92. Book 135 also comprises first and second laminating pads 60, 62 and first and second steel plates 70, 72 as is discussed above in relation to FIG. 7.

When book 135 is positioned between upper and lower platens 42,44 of laminator 40 as shown in FIG. 10, the laminator is closed and a heat cycle in the range of 175° F. to 300° F., and most preferably in the range of 180° F. to 275° F., is applied to book 135 for a period of 10 to 25 minutes with a ram pressure that varies depending upon sheet size or the ram size of the laminator 40, but which is typically approximately 1000 p.s.i. with an 18 inch diameter ram. The laminator 40 is then caused to execute a chill cycle, preferably with a corresponding increase in ram pressure. For example, the chill temperature may be in the range of 40° F. to 65° F. and last for a period of 10 to 25 minutes. A ram pressure increase of approximately 25% over the pressure used for the heat cycle has been found to be most preferable.

Subsequent to the above described second lamination cycle as illustrated in FIG. 10, a sheet of plastic card stock is provided which comprises at least core 33 with at least one surface 34,35 thereof covered by a layer of ink 36, and with at least one surface 34,35 thereof covered by a layer of overlaminate film 38, 39. Preferably plastic card stock manufactured in accordance with the present invention comprises core 33 covered on both surfaces 34,35 with a layer of ink 36 which is positioned between layers of overlaminate film 38,39, all of which has been laminated together as described. One or more cards 10 then may be cut from the resulting plastic card stock and card 10 will have a thickness in the range of 0.028 inches to 0.032 inches with variation in overall thickness across the surfaces 12, 14 thereof being no greater than approximately 0.0005 inches. The one or more cards 10 can thus be said to have a surface smoothness of approximately 0.0005 inches or better. Thus, a card 10 manufactured in accordance with the present invention includes at least one surface 12,14 at preferably both surfaces 12,14 that are sufficiently smooth and regular to receive dye sublimation printing.

Those skilled in the art will recognize that the foregoing description has set forth the preferred embodiment of the invention in particular detail and it must be understood that numerous modifications, substitutions, and changes may be undertaken without departing from the true spirit and scope of the present invention as defined by the ensuing claims.

What is claimed is:

1. A process for incorporating at least one electronic element in the manufacture of a plastic card, comprising the steps of:

(a) providing first and second plastic core sheets;

(b) positioning said at least one electronic element in the absence of a non-electronic carrier directly between said first and second plastic core sheets to form a core, said plastic core sheets defining a pair of inner and outer surfaces of said core;

(c) positioning said core in a laminator apparatus, and subjecting said core to a heat and pressure cycle, said heat and pressure cycle comprising the steps of:

(i) heating said core for a first period of time;

(ii) applying a first pressure to said core for a second period of time such that said at least one electronic element is encapsulated by said core;

(iii) cooling said core while applying a second pressure to said core, (d) coating at least one of said outer surfaces of said core with a layer of ink; and (e) applying a layer of overlaminate film to at least one of said outer surfaces of said core.

2. The process for incorporating at least one electronic element in the manufacture of a plastic card as recited in claim 1, wherein said laminator apparatus has first and second laminating plates, at least one of said first and second laminating plates having a matte finish for creating a textured surface on at least one of said outer surfaces of said core.

3. The process for incorporating at least one electronic element in the manufacture of a plastic card as recited in claim 2, wherein each of said first and second laminating plates has a matte finish for creating said textured surface on both of said outer surfaces of said core.

4. The process for incorporating at least one electronic element in the manufacture of a plastic card as recited in claim 1, wherein said first and second plastic core sheets are made from a material selected from the group consisting of polyvinyl chloride, polyester, and acrylonitrile-butadiene-styrene, each of said sheets having a thickness in the range of 0.007 to 0.024 inch.

5. The process for incorporating at least one electronic element in the manufacture of a plastic card as recited in claim 4, wherein said first and second plastic core sheets have a thickness of approximately 0.0125 inch.

6. The process for incorporating at least one electronic element in the manufacture of a plastic card as recited in claim 1, wherein said second pressure is greater than said first pressure.

7. The process for incorporating at least one electronic element in the manufacture of a plastic card as recited in claim 6, wherein said second pressure is at least approximately 25% greater than said first pressure.

8. The process for incorporating at least one electronic element in the manufacture of a plastic card as recited in claim 1, wherein said core is heated in step (c)(i) to a temperature in the range of 275° F. to 400° F. and said first period of time is at least five (5) minutes.

9. The process for incorporating at least one electronic element in the manufacture of a plastic card as recited in claim 1, wherein said first pressure is approximately 1000 p.s.i. and said second period of time is at least 10 minutes.

10. The process for incorporating at least one electronic element in the manufacture of a plastic card as recited in claim 1, wherein said step (d) is carried out utilizing a printing press.

11. The process for incorporating at least one electronic element in the manufacture of a plastic card as recited in claim 1, wherein said step (d) is carried out utilizing a coating technique selected form the group consisting of silk screen printing, offset printing, letterpress printing, screen printing, roller coating, spray printing, and litho-printing.

12. The process for incorporating at least one electronic element in the manufacture of a plastic card as recited in claim 1, wherein said step (e) of applying a layer of overlaminate film comprises the further steps of:
  (a) positioning an overlaminate film on at least one ink coated surface of said core;
  (b) subjecting said core to a second heat and pressure cycle comprising the steps of:
    (i) heating said core to a temperature between approximately 175° F. to 300° F. for approximately 10 to 25 minutes;
    (ii) applying approximately 1000 p.s.i. pressure to said core; and
    (iii) cooling said core to a temperature in the range of approximately 40° F. to 65° F. for approximately 10 to 25 minutes.

13. The process for incorporating at least one electronic element in the manufacture of a plastic card as recited in claim 1, wherein said at least one electronic element is a micro-chip and an associated wire antenna.

14. The process for incorporating at least one electronic element in the manufacture of a plastic card as recited in claim 1, wherein said at least one electronic element is a micro-chip and an associated circuit board antenna.

15. The process for incorporating at least one electronic element in the manufacture of a plastic card as recited in claim 1, wherein said at least one electronic element is a read/write integrated chip and an associated antenna.

16. A hot lamination process for the manufacture of plastic cards, said process comprising the steps of:
  (a) providing first and second plastic core sheets;
  (b) positioning at least one electronic element in the absence of a non-electronic carrier directly between said first and second plastic core sheets to form a layered core;
  (c) positioning said core in a laminator apparatus, and subjecting said core to a heat and pressure cycle, said heat and pressure cycle comprising the steps of:
    (i) heating said core in said laminator, in the presence of a minimal first ram pressure, to a temperature which causes controlled flow of said plastic which makes up said first and second plastic core sheets;
    (ii) applying a second pressure uniformly across said core for encapsulating said at least one electronic element within said controlled flow plastic;
    (iii) subsequently cooling said core in conjunction with the concurrent application of a third pressure uniformly across said core, said core including and upper and lower surfaces;
  (d) printing on at least one of said upper and lower surfaces of said core such that a layer of ink is applied to at least a portion of said at least one upper and lower surface of said core.

17. The method as recited in claim 16 wherein said first and second core layers are devoid of any appreciable cut-outs.

* * * * *